US006663148B2

(12) United States Patent
Bonora et al.

(10) Patent No.: US 6,663,148 B2
(45) Date of Patent: Dec. 16, 2003

(54) SYSTEM FOR PREVENTING IMPROPER INSERTION OF FOUP DOOR INTO FOUP

(75) Inventors: Anthony C. Bonora, Woodside, CA (US); Gary M. Gallagher, Austin, TX (US); Michael Ng, Campbell, CA (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/020,761

(22) Filed: Dec. 13, 2001

(65) Prior Publication Data
US 2002/0106266 A1 Aug. 8, 2002

Related U.S. Application Data
(60) Provisional application No. 60/255,467, filed on Dec. 13, 2000.

(51) Int. Cl.[7] .................................................. E05C 1/06
(52) U.S. Cl. ............................. 292/159; 292/DIG. 12; 206/710; 220/324
(58) Field of Search ........................... 292/159, 256.5, 292/257, DIG. 12, DIG. 11, 32–43; 206/710–712; 220/324; 70/DIG. 34

(56) References Cited

U.S. PATENT DOCUMENTS

| 368,784 A | 8/1887 | Rippe |
| 2,920,474 A | 1/1960 | Johns |
| 2,947,160 A | 8/1960 | Wolters |
| 3,464,726 A | * 9/1969 | Dean |
| 4,408,546 A | * 10/1983 | Schmidt ..................... 109/75 |
| 4,532,970 A | 8/1985 | Tullis et al. |
| 4,534,389 A | 8/1985 | Tullis |
| 4,620,733 A | * 11/1986 | Gaunt ........................ 292/39 |
| 4,870,841 A | * 10/1989 | Cudd ......................... 70/107 |
| 4,995,430 A | 2/1991 | Bonora et al. |
| 5,263,749 A | * 11/1993 | Errani ........................ 292/40 |
| 5,294,013 A | * 3/1994 | Sasaki ....................... 220/241 |
| 5,341,752 A | * 8/1994 | Hambleton ................. 109/59 |
| 5,711,427 A | 1/1998 | Nyseth |
| 5,957,292 A | 9/1999 | Mikkelsen et al. |
| 6,105,782 A | 8/2000 | Fujimori et al. |
| 6,193,068 B1 | * 2/2001 | Lewis ....................... 206/710 |

OTHER PUBLICATIONS

U.S. patent application Ser. No. 10/022,309, Bonora, filed Dec. 13, 2001.
Mihir Parikh, Ulirich Kaempf—SMIF: A Technology for Wafer Cassette Transfer in VLSI Manufacturing; Solid State Technology; Jul. 1984, pp. 111–115.

* cited by examiner

Primary Examiner—Gary Estremsky
(74) Attorney, Agent, or Firm—Patterson, Thuente, Skaar, & Christensen, P.A.

(57) ABSTRACT

An apparatus for preventing improper engagement of a pod door and a pod. Specifically, misalignment of at least one latch finger connected t the pod door with latch engagement slots in the pod prevents a pod door from mechanically engaging a pod.

12 Claims, 13 Drawing Sheets

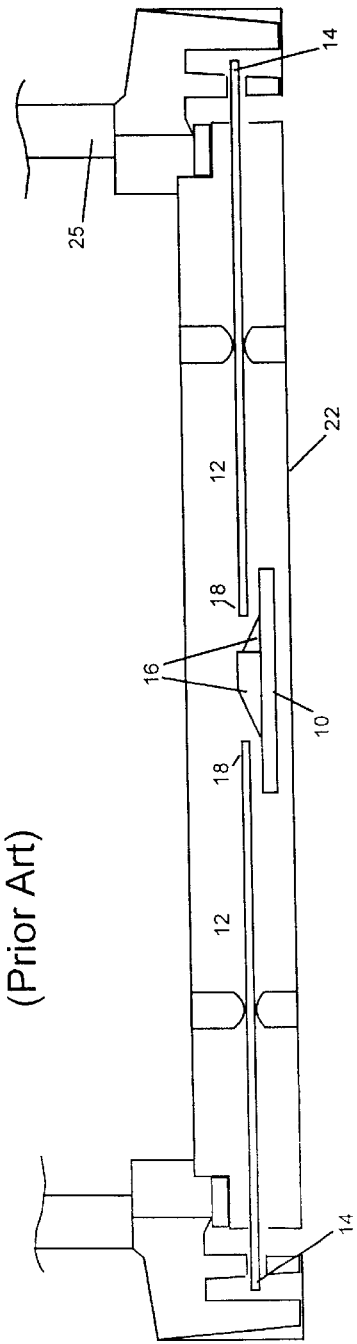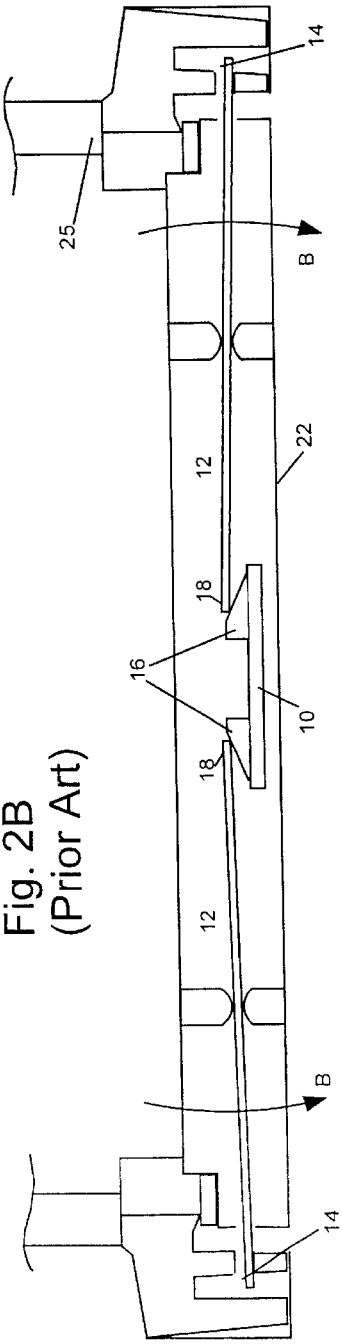
Fig. 2A
(Prior Art)
Fig. 2B
(Prior Art)

Fig. 12
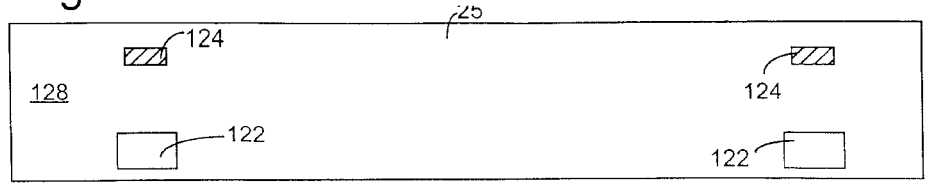
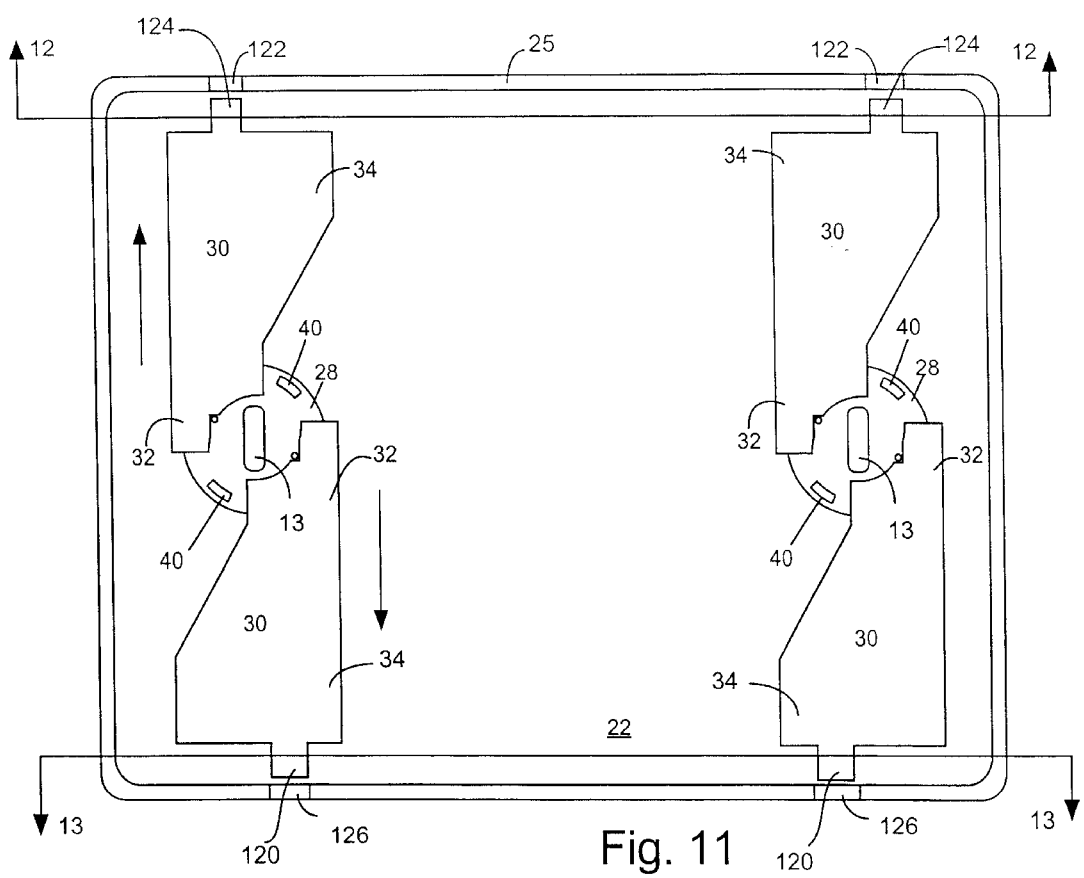
Fig. 11
Fig. 13
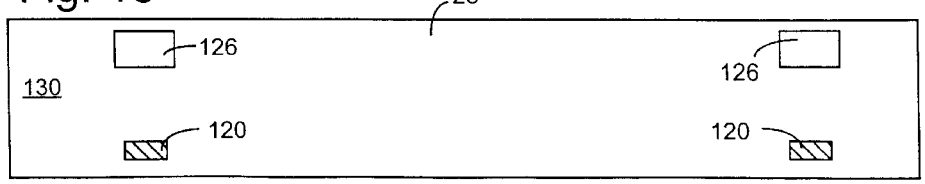

SYSTEM FOR PREVENTING IMPROPER INSERTION OF FOUP DOOR INTO FOUP

CROSS-REFERENCE TO RELATED APPLICATIONS

This application claims the benefit of U.S. Provisional Application No. 60/255,467, System For Preventing Improper Insertion of Foup Door Into Foup, by Anthony C. Bonora, Gary M. Gallagher, Michael Ng, filed Dec. 13, 2000, incorporated herein by reference.

BACKGROUND OF THE INVENTION

1. Field of the Invention

The present invention relates to front opening unified pods, or FOUPs, and in particular to FOUPs which include mechanisms for preventing the FOUP door from being improperly inserted into the FOUP.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles and molecular contaminants become of interest.

FOUPs are in general comprised of a vertically oriented FOUP door which mates with a FOUP shell to provide a sealed, ultraclean interior environment in which wafers may be stored and transferred. The wafers are supported either in a cassette which may be inserted into the shell, or to shelves mounted to the interior of the shell.

In order to transfer wafers between a FOUP and a process tool within a wafer fab, a pod is typically loaded (either manually or automatedly) onto a load port on a front of the tool so that the pod door lies adjacent the port door of the process tool. Thereafter, latch keys within the port door engage a latch assembly within the FOUP door to decouple the FOUP door from the FOUP, and at the same time couple the FOUP door to the port door. Details relating to such a latch assembly within a pod door are disclosed for example in U.S. Pat. No. 4,995,430, entitled "Sealable Transportable Container Having Improved Latch Mechanism", to Bonora et al., which patent is owned by the assignee of the present application. The assembly disclosed therein includes a two-stage latching operation to securely latch a pod door to a pod shell as shown in prior art FIGS. 1 and 2A–2B. The latch assembly is mounted within the pod door, and includes a latch hub 28 which engages first and second translating latch plates 30. The port door includes a pair of latch keys that extend into slots 13 formed in the latch hub to thereby rotate the latch hubs clockwise and counterclockwise. Rotation of each latch hub 28 will cause translation of the first and second latch plates 30 in opposite directions.

FIG. 1 is a front view of an interior of the pod door illustrating the latch assembly in the first stage of the door latching operation. When a pod door is returned from its engagement with the port door to the pod, the latch keys within the port door rotate the latch hub 28 to thereby translate the latch plates 30 outwardly so that latch fingers 14 on the distal ends of the latch plates 30 extend in the direction of arrows A into slots 15 formed in the pod shell. The slots 15 conventionally include a transverse wall 17 formed in the pod shell which divides the slot generally in half. The fingers 14 include a space 19 which aligns over the wall 17 when the fingers 14 are received within the slots 15.

FIG. 2A is a side view through line 2—2 of the latch assembly shown in FIG. 1, and FIG. 2B is a side view as in FIG. 2A but illustrating the second stage of the door latching operation. In particular, the latch hub 28 further includes a pair of ramps 40 so that, after the fingers 14 have engaged within the slots 15 of the pod shell, further rotation of the hub causes the proximal ends 32 of the latch plates engaged with the hub to ride up the ramps. This causes the latch plates to pivot in the direction of arrows B, about axes lying in the plane of each latch plate and perpendicular to the direction of latch plate translation. The effect of this pivoting during the second stage is to pull the pod door tightly against the pod shell to thereby provide a firm, airtight seal between the pod door and shell.

In order to separate a pod door from a pod shell, as when a pod is initially loaded onto a load port interface for wafer transfer, mechanisms within the port door engage the rotatable hub 28 and rotate the hub in the opposite direction than for pod latching. This rotation disengages the latch fingers 14 from the pod shell and allows separation of the pod door from the pod shell.

The Semiconductor Equipment and Materials International ("SEMI") standard relating to FOUP doors requires that the positions of the door mounting features, i.e., the rotatable latch hubs, the fingers on the latch plates and the slots in the FOUP shell, be symmetrical about a horizontal axis. The authors of the standard believed it would be convenient to allow the FOUP door to be inserted into the FOUP right side up or up side down. However, as it turns out, this symmetry of the mounting mechanisms about the horizontal axis provides a significant disadvantage as explained with reference to FIG. 3.

FIG. 3 shows a FOUP 20 housing a plurality of wafers 21. The FOUP door 22 is conventionally provided with a plurality of protrusions 23 defining a plurality of recesses 24 therebetween. The position of the protrusions 23 and recesses 24 are precision controlled so that upon insertion of the FOUP door 22 into FOUP 20, the wafers 21 within the FOUP seat within recesses 24 to prevent the wafers 21 from getting dislodged. However, if the FOUP door is inserted up side down, the wafers 21 may not align within recesses 24, and instead the protrusions 23 may contact the wafers 21. This is true because in a conventional FOUP, a distance X between a top wafer and the top interior surface of the FOUP is different than a distance Y between the bottom wafer and the bottom interior surface of the FOUP, and thus the position of the protrusions and recesses are not symmetrical about the horizontal axis. Contact between the protrusions on the port door and the wafers can result in damage and/or destruction of each of the wafers within the FOUP. Thus, for 300 mm semiconductor wafers, an improper seating of the FOUP door in the FOUP can result insignificant monetary losses.

The error in loading a FOUP door into a FOUP up side down frequently occurs when the FOUP door is manually returned to an empty FOUP. For example, after FOUPs go through a cleaning process, technicians often manually return the FOUP door to the FOUP. FOUP doors are currently marked with an indicator as to which is the top and bottom side of a FOUP door. However, this marking is often overlooked or not understood when a FOUP door is manually inserted into the FOUP.

The empty FOUP including the up side down door is subsequently transferred to a load port. As indicated above, conventional load ports operate to transfer the FOUP door to and from the FOUP regardless of whether the door is up side down or right side up. Thus, upon arrival at the load port, the up side down FOUP door is removed as usual and wafers are loaded into the FOUP. However, upon the subsequent return of the FOUP door to the FOUP by the load port, the up side down door is driven into contact with the wafers, and damage and/or destruction of the wafers can occur.

SUMMARY OF THE INVENTION

It is therefore an advantage of the present invention to provide a system for preventing FOUP doors from improper insertion into a FOUP.

It is a further advantage of the present invention to provide a mechanical system which physically blocks a FOUP door from being improperly inserted into a FOUP thereby preventing damage to the wafers therein.

It is another advantage of the present invention to provide a mechanical system for preventing improper insertion of a FOUP door into a FOUP without altering or adding to the outer edges or surfaces of a sealed FOUP.

These and other advantages are provided by the present invention in which the size, shape and/or location of the latch plate fingers and corresponding slots at the top edge of the FOUP are different than the latch plate fingers and corresponding slots on the bottom edge of the FOUP. Thus, unless the FOUP is correctly oriented right side up upon insertion of the door to the FOUP, the door will not properly fit into the FOUP. Thus, when a sealed FOUP is received at a load port to receive wafers, the FOUP door is right side up and the danger of wafer damage due to an up side down FOUP door is removed.

BRIEF DESCRIPTION OF THE DRAWINGS

The present invention will now be described with reference to the drawings in which:

FIGS. 2A and 2B are prior art side views of the interior of a FOUP door and shell;

FIG. 11 is a front view of an interior of a FOUP door and shell showing how the mounting features of FIG. 8 prevent an up side down FOUP door from being coupled to the FOUP;

FIG. 12 is a cross section view through line 12—12 of FIG. 11;

FIG. 13 is a cross section view through line 13—13 of FIG. 11;

DETAILED DESCRIPTION

The present invention will now be described with reference to FIGS. 4–22 which in preferred embodiments relate to a mechanical system for preventing improper insertion of a FOUP door into a FOUP. While the present invention is described with respect to a FOUP for housing 300 mm semiconductor wafers, it is understood that the present invention may be utilized on containers other than FOUPS and other than for housing semiconductor wafers. For example, the present invention may be utilized on bottom opening SMIF pods. Additionally, it is understood that the present invention may be utilized on containers housing workpieces such as reticles and flat panel displays. Moreover, while preferred embodiments of the invention relate to mechanical systems for physically preventing manual insertion of a FOUP door into a FOUP in an incorrect position, in an alternative embodiment, the present invention may operate with sensors to prevent automated insertion of a FOUP door into a FOUP in an incorrect position as explained hereinafter.

Figure 1:
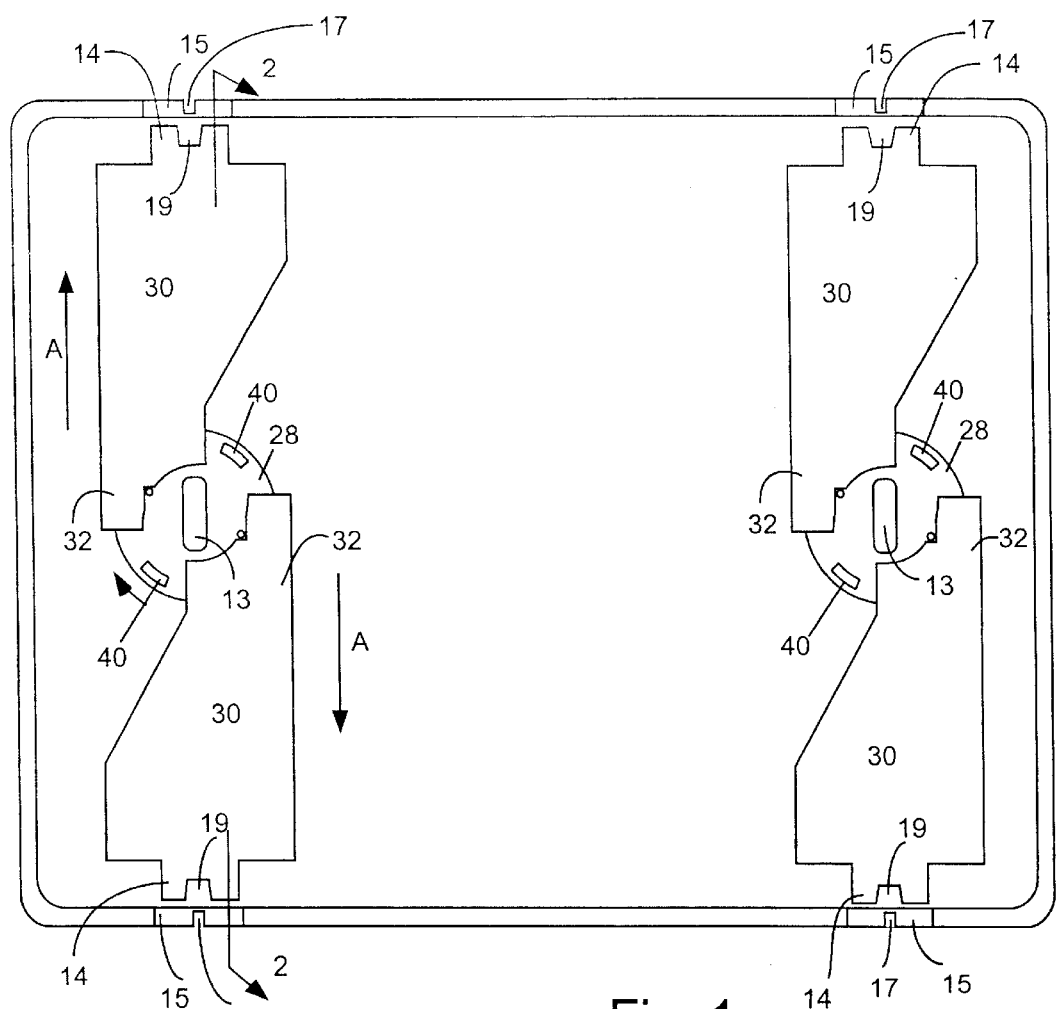
FIG. 1 is a prior art front view of the interior of a FOUP door and shell.
Figure 3:
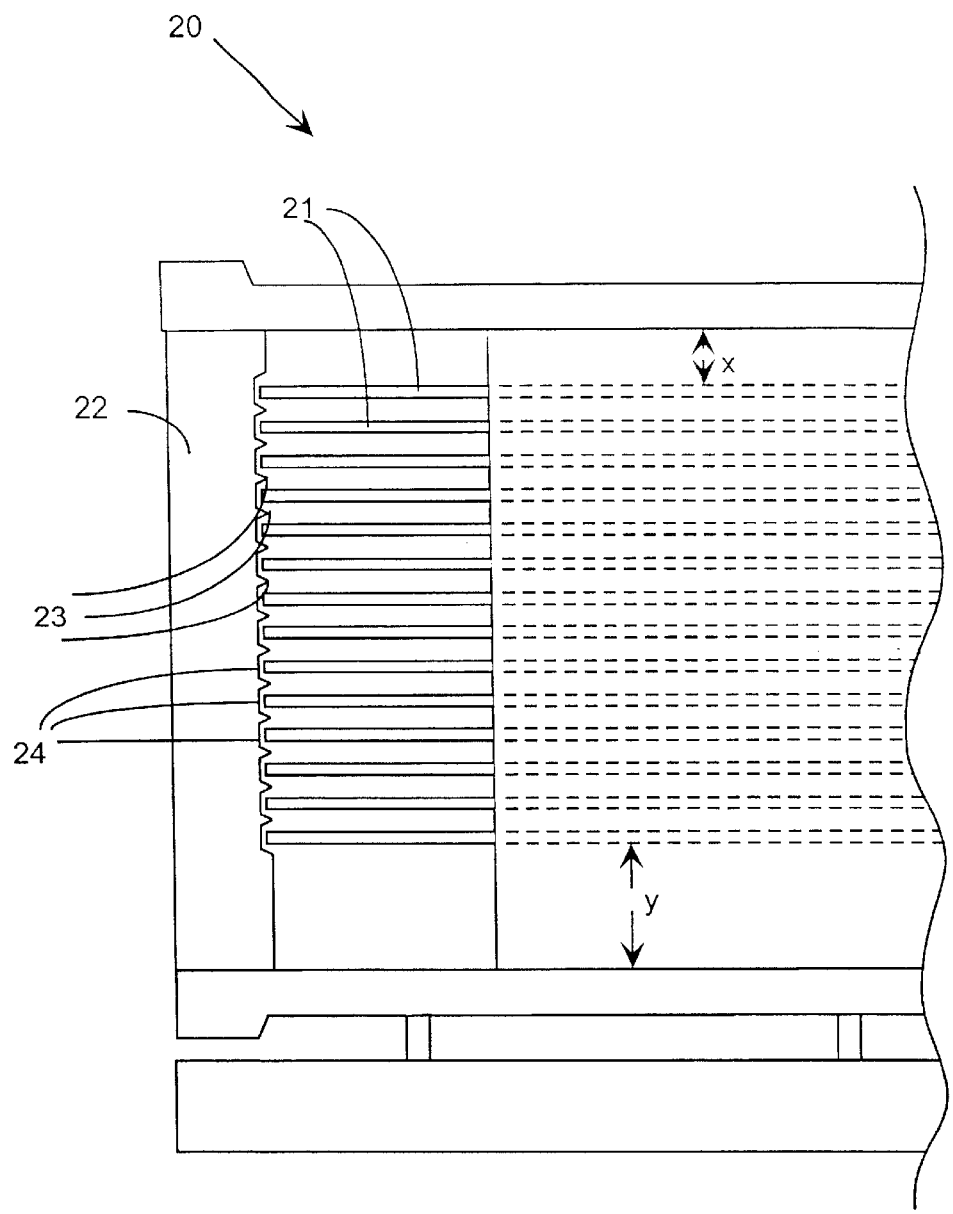
FIG. 3 is a prior art side view of the interior of a FOUP showing the recesses within the FOUP door for preventing semiconductor wafers from becoming dislodged when the FOUP is sealed.
Figure 4:
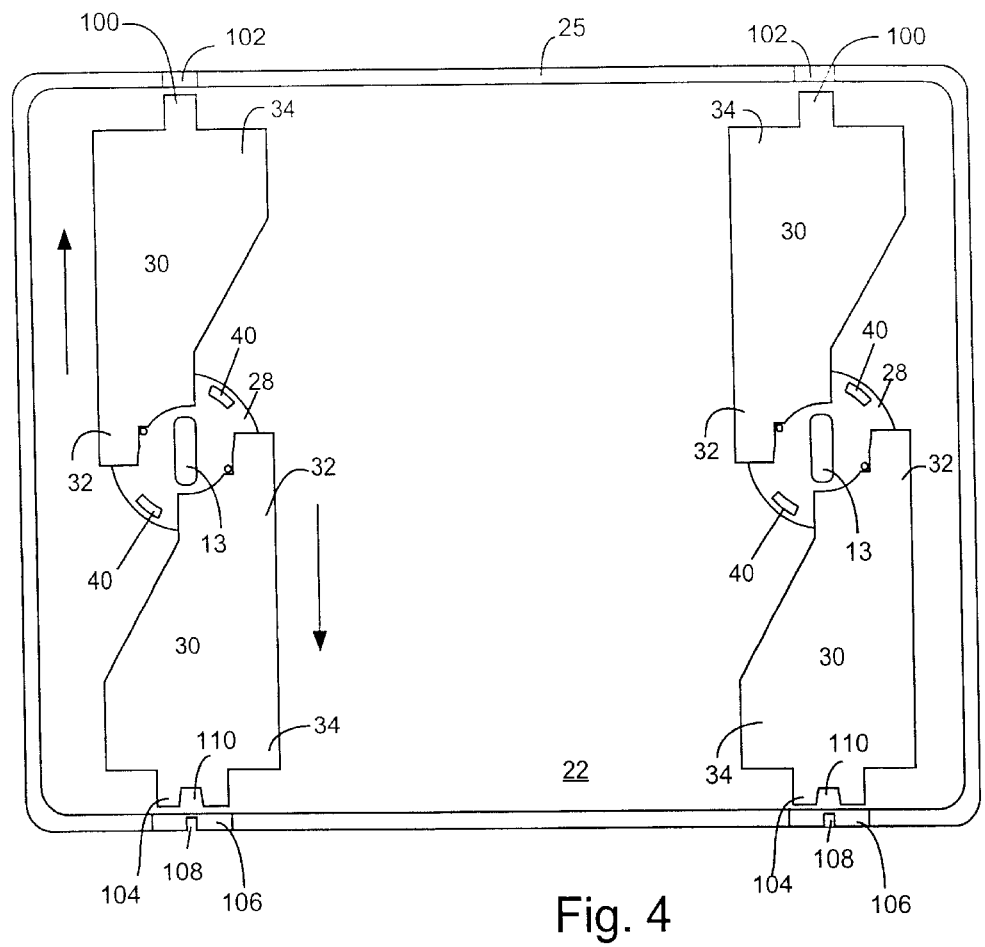
FIG. 4 is a front view of the interior of a FOUP door and shell according to the present invention including asymmetric top and bottom mounting features.

Referring now to FIG. 4, there is shown a first embodiment of a FOUP according to the present invention including asymmetric top and bottom mounting features. The figure shows a FOUP door 22 fitting within a FOUP shell 25 (only the lower edge of which is shown in FIG. 4). With the exception of the latch plate fingers and slots in the FOUP shell described hereinafter, the latch assembly as used to advance and retract the fingers into and out of engagement with the pod shell are not critical to the present invention and they may vary in alternative embodiments. One such latch assembly for use with the present invention is as described in the Background of the Invention section including a two-stage latching operation. Those parts in the figures having like reference numerals to those described in the Background of the Invention section operate as described in the Background of the Invention section.

FIG. 4 further shows latch fingers 100 at the distal ends of the top latch plates 30 (reference to top, bottom, upper and lower herein refers to the perspective of the drawing sheets). The fingers 100 are sized and positioned to fit within respective slots 102 in the top edge of the pod shell upon actuation of latch hub 28 and advancing of the top latch plates 30. The latch assembly further includes fingers 104 at the distal ends 34 of the bottom latch plates 30. The fingers 104 are sized and configured to fit within respective slots 106 formed in a bottom edge of the FOUP shell. Fingers 104 and slots 106 may be as described in the Background of the Invention section, where slot 106 includes a transverse wall 108 which aligns with a space 110 when the lower latch plates 30 advance fingers 104 into slots 106.

Figure 5:
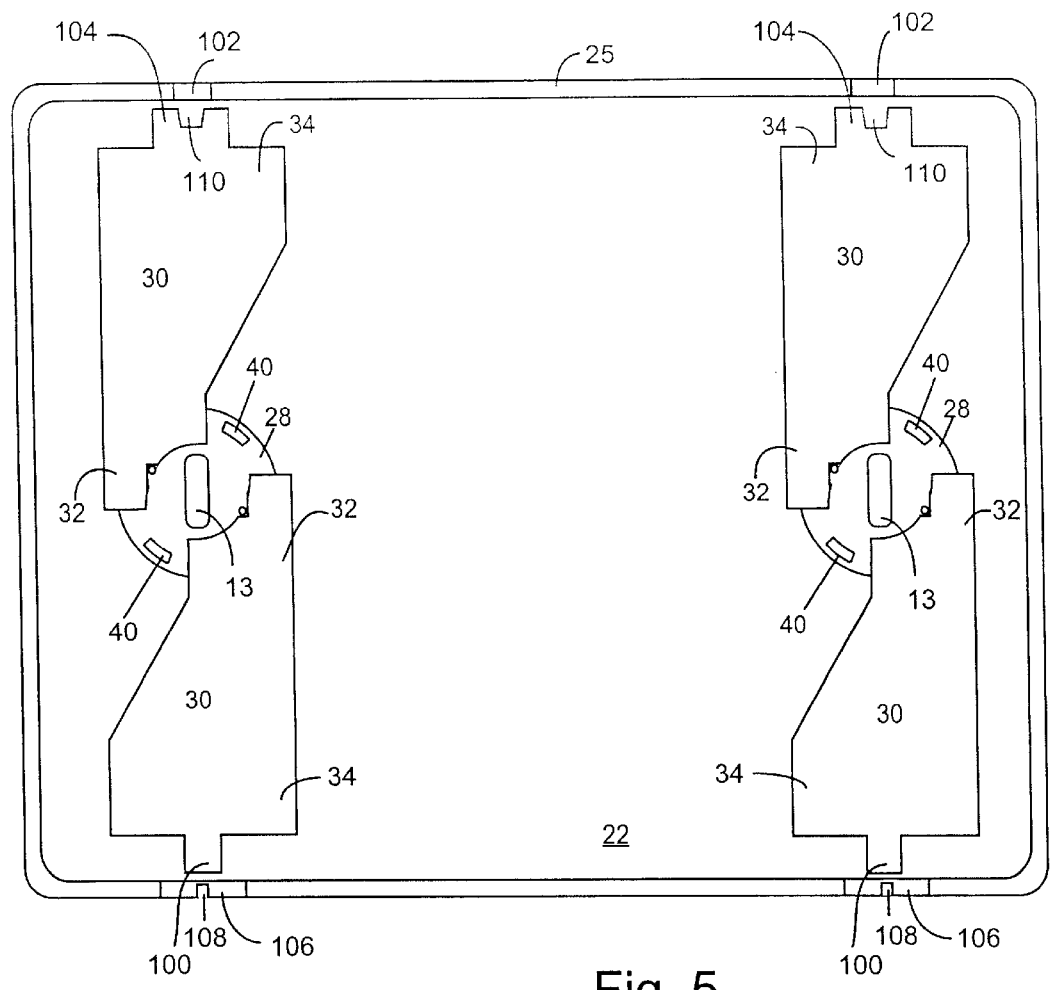
FIG. 5 is a front view of the interior of a FOUP door and shell showing how the mounting features of FIG. 4 prevent coupling of an up side down FOUP door into a FOUP.

Referring now to FIG. 5, there is shown a FOUP door 22 which is being inserted up side down into the FOUP. As shown, when attempt is made to insert the FOUP door up side down, the fingers 104 are blocked and prevented from entering slots 102 at the top side of the FOUP, and fingers 100 are blocked (by wall 108) and prevented from entering slots 106 at the bottom of the FOUP. Thus, if attempt is made to insert the door into the FOUP up side down as shown in FIG. 5, the hub 28 will be prevented from rotating and the FOUP door will not couple to the FOUP.

In the embodiments shown in FIGS. 4 and 5, it is understood that the positions of the top fingers 100 and slots 102 on the one hand and the bottom fingers 104 and slots 106 on the other may be switched. It is further understood that other footprints and shapes of the fingers are contemplated than those shown in FIGS. 4 and 5, with the qualification that the top and bottom fingers fit in their respective slots when the FOUP door is properly seated in the FOUP and that at least one of the top pair and bottom pair not fit in the adjacent slot when the FOUP door is improperly seated in the FOUP.

Figure 6:
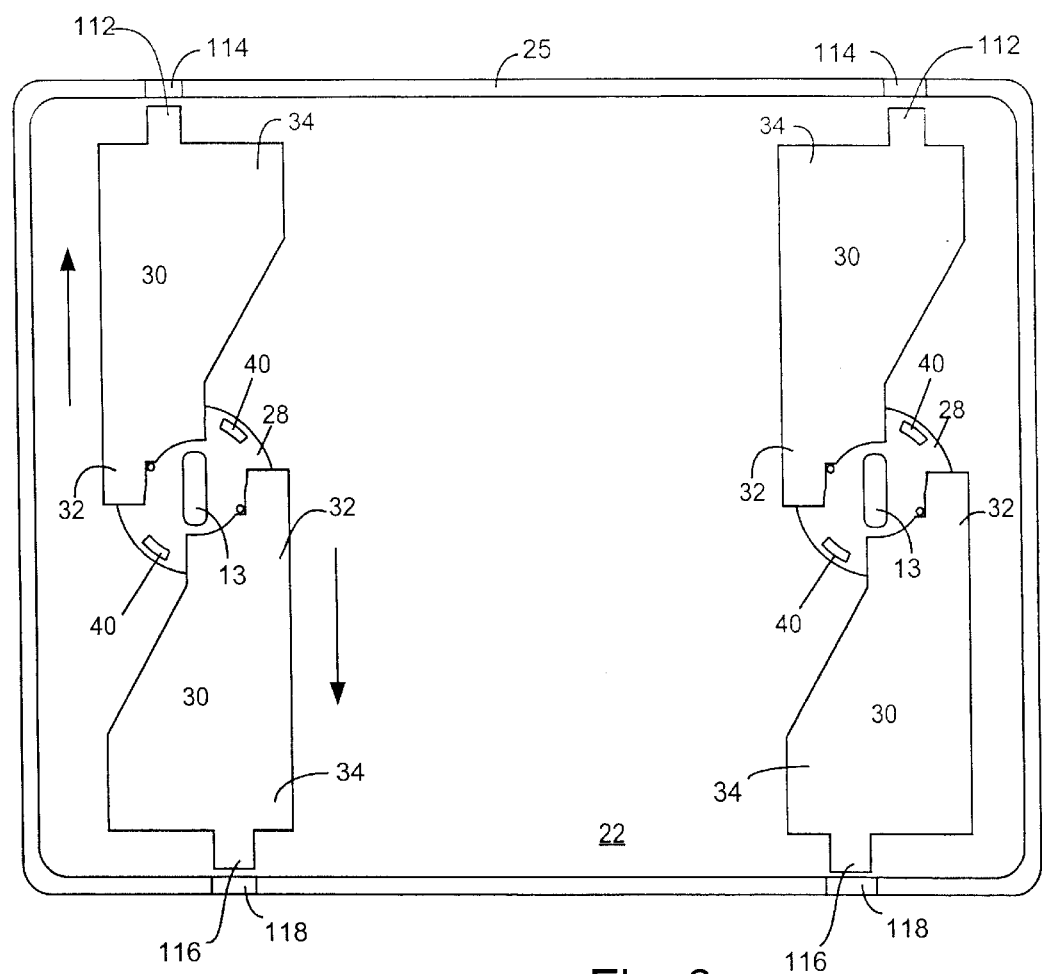
FIG. 6 is a front view of an interior of a FOUP door and shell showing an alternative embodiment of the asymmetric mounting features for preventing improper insertion of a FOUP door into a FOUP.
Figure 7:
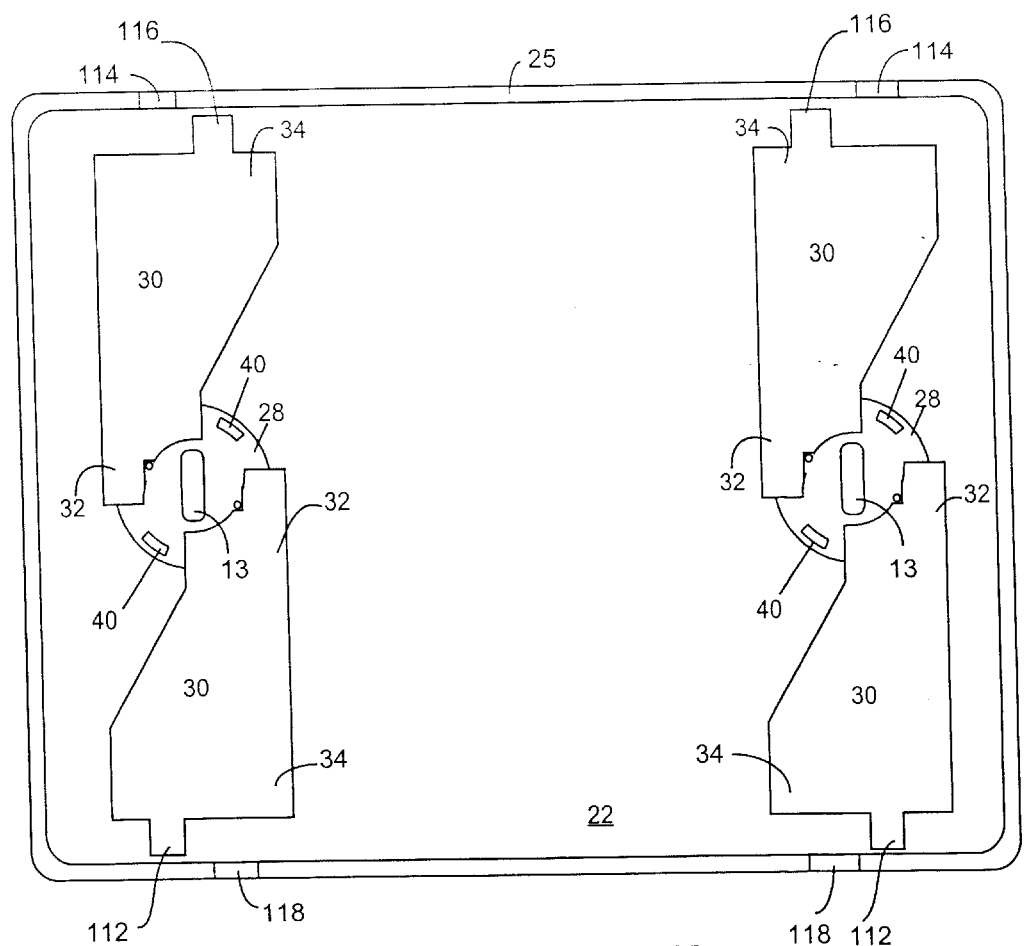
FIG. 7 is a front view of an interior of a FOUP door and shell showing how the mounting features of FIG. 6 prevent an up side down FOUP door from being coupled to the FOUP.
Figure 9:
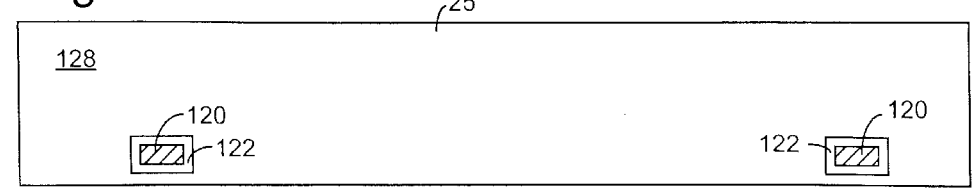
FIG. 9 is a cross section view through line 9—9 of FIG. 8.
Figure 8:
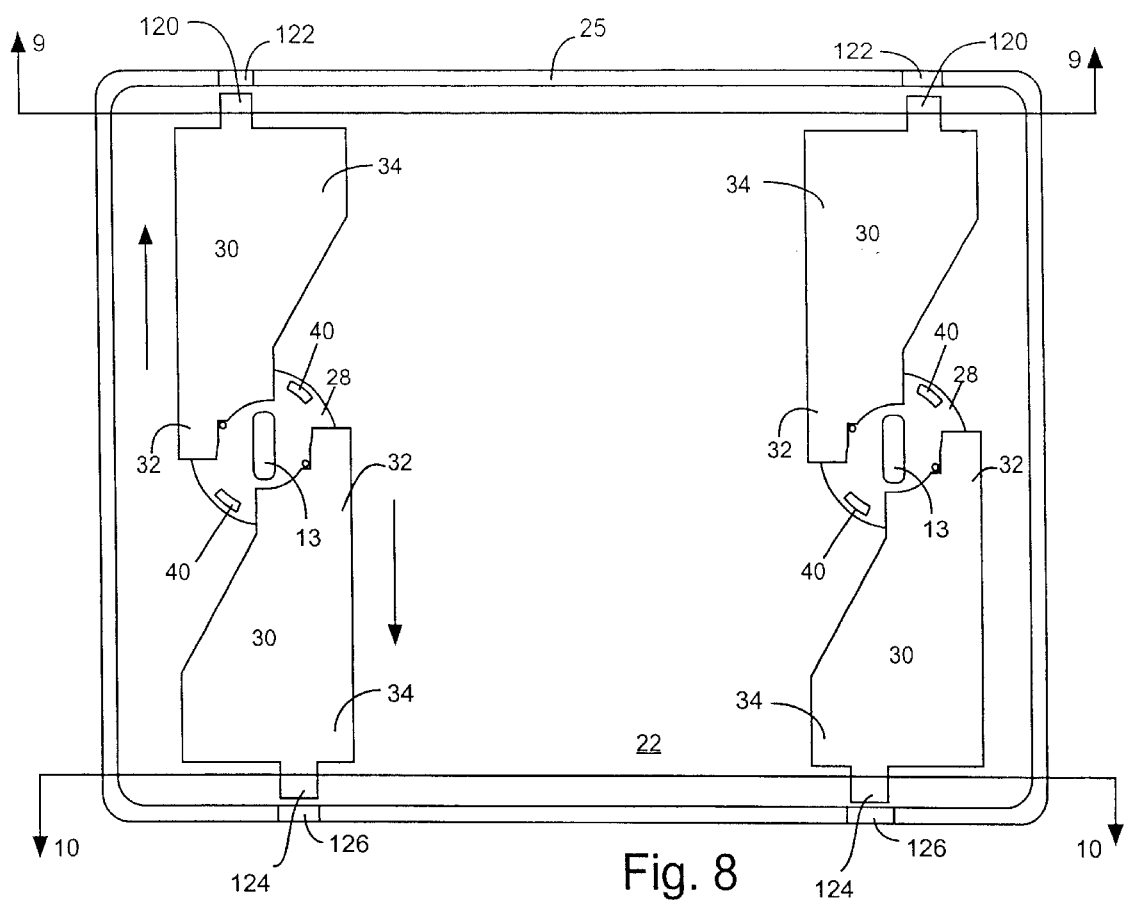
FIG. 8 is a front view of an interior of a FOUP door and shell showing asymmetric mounting features according to a further alternative embodiment of the present invention for preventing improper coupling of a FOUP door into a FOUP.
Figure 10:
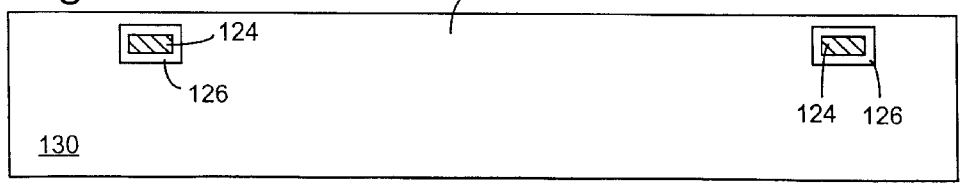
FIG. 10 is a cross section view through line 10—10 of FIG. 8.

Referring now to FIGS. 6 and 7, there is shown an alternative embodiment of the present invention. In this embodiment, the shape of the four fingers 112, 116 and slots 114, 118 may be identical to each other, but the fingers may be positioned on the latch plates 30 so that the fingers 112 will fit in the slots 114 and the fingers 116 will fit in slots 118 only when the door is positioned right side up. For example, fingers 112 formed on latch plates 30 at the top of the FOUP may be positioned near to the sides of the FOUP, whereas the fingers 116 formed on the latch plates 30 on the bottom of the FOUP may be spaced relatively more inward from the sides of the FOUP. Similarly, the slots 114 in the shell at the top of the FOUP may be located near to the sides, and the slots 118 in the shell at the bottom of the FOUP may be spaced relatively more inward from the sides. In such an embodiment, when the FOUP door is correctly positioned right side up in the FOUP, the fingers at the top and bottom will properly align within the slots at the top and bottom. However, as shown in FIG. 7, when attempt is made to return the FOUP door 22 to the FOUP in an up side down position, the fingers 116 will not align with the slots 114 at the top of the FOUP and the fingers 112 will not align with the slots 118 at the bottom of the FOUP. As would be appreciated by those of skill in the art, the fingers 112, 116 maybe placed at other positions on the latch plates than shown in FIGS. 6 and 7, with the provision that the fingers align with the slots when the FOUP door is inserted right side up and that the fingers not align with the slots when the FOUP door is inserted up side down.

Up to this point, the invention has been disclosed as varying the positions of the top fingers/slots relative to the bottom fingers/slots in a first dimension (i.e., left to right in the plane of the drawing sheets). However, it is further contemplated that the relative positions of the fingers/slots at the top of the FOUP may be varied relative to the positions of the fingers/slots at the bottom of the FOUP in a second direction (i.e., into and out of the plane of the drawing sheets). One such embodiment is shown in FIGS. 8–13. In this embodiment, the top latch plates may be angled downward from the proximal end to the distal end of the plate (i.e., into the drawing sheet) so that the fingers 120 fit into slots 122 at the bottom of the outer edge 128 in the FOUP shell when the FOUP door is inserted right side up. Similarly, the bottom latch plates may be angled upward from the proximal end to the distal end of the plate (i.e., out of the drawing sheet) so that the fingers 124 fit into slots 126 at the top of the outer edge 130 in the FOUP shell when the FOUP door is inserted right side up.

On the other hand, when the FOUP door 22 is inserted up side down, as shown in FIGS. 11–13, the fingers 124 do not align within slots 122 in the upper edge 128 and the fingers 120 do not align within slots 126 in the lower edge 130.

Figure 15:
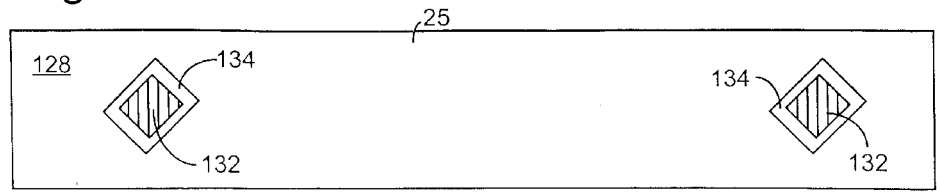
FIG. 15 is a cross section view through line 15—15 of FIG. 14.
Figure 14:
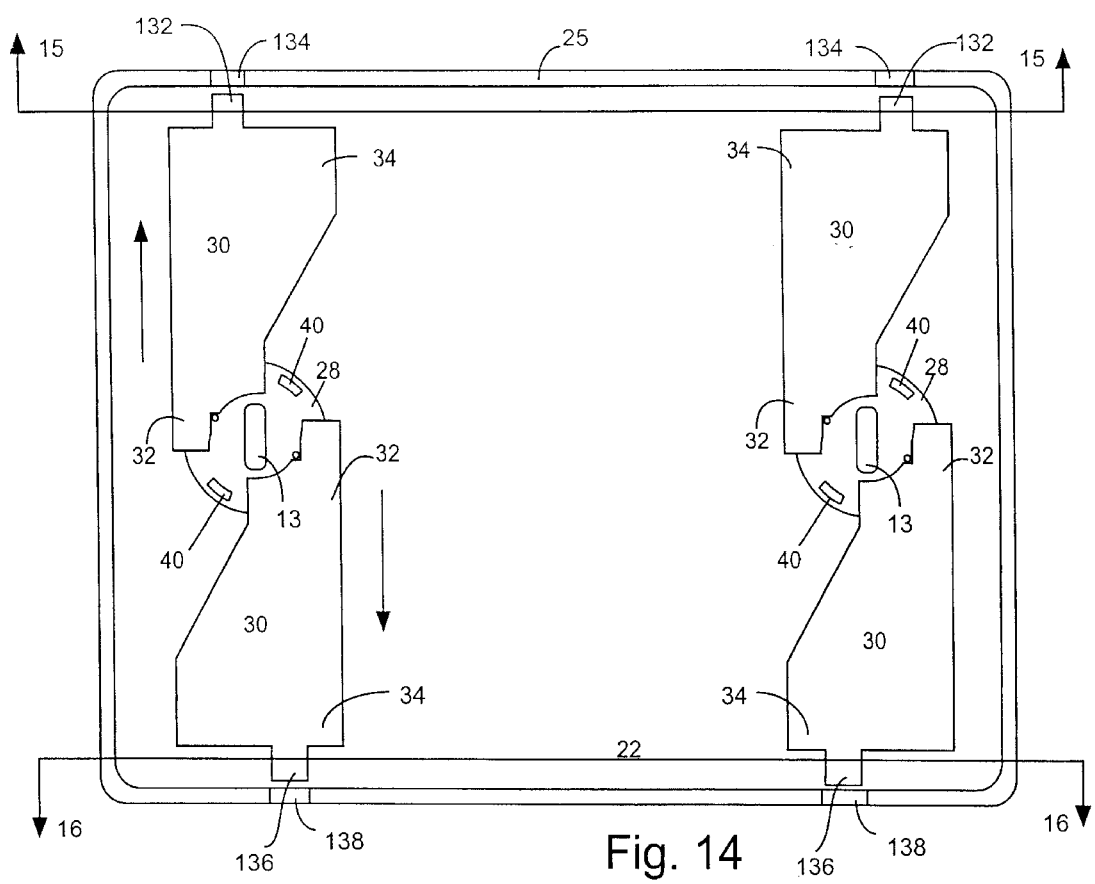
FIG. 14 is a front view of an interior of a FOUP door and shell showing asymmetric mounting features according to a further alternative embodiment of the present invention for preventing improper coupling of a FOUP door into a FOUP.
Figure 16:
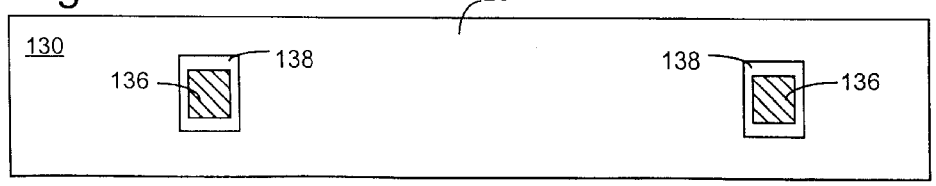
FIG. 16 is a cross section view through line 16—16 of FIG. 14.
Figure 18:
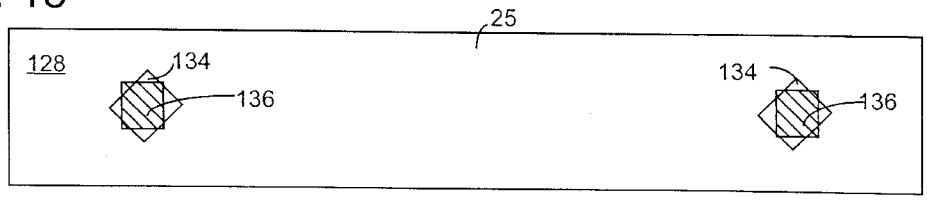
FIG. 18 is a cross section view through line 18—18 of FIG. 17.
Figure 17:
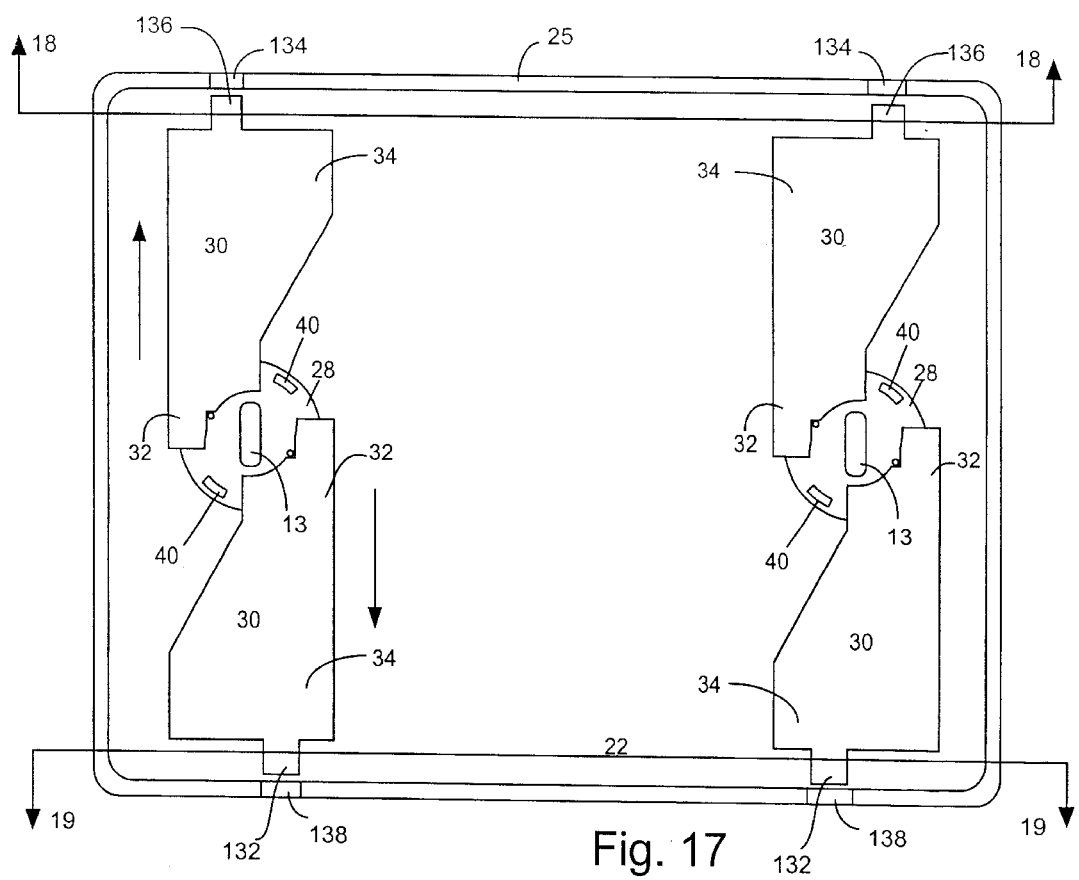
FIG. 17 is a front view of an interior of a FOUP door and shell showing how the mounting features of FIG. 14 prevent an up side down FOUP door from being coupled to the FOUP.
Figure 19:
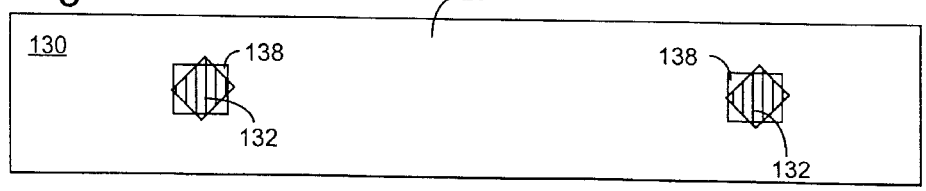
FIG. 19 is a cross section view through line 19—19 of FIG. 17.

In a further alternative embodiment shown in FIGS. 14—19, the shape of the fingers and slots may be different in the top edge 128 than in the bottom edge 130. For example, as shown in FIGS. 14–16, fingers 132 fit within slots 134 in the upper edge 128, and fingers 136 fit within slots 138 at the bottom edge 130, when the FOUP door 22 is seated in the proper position within the FOUP. However, as shown in FIGS. 17–19, when the FOUP door 22 is improperly positioned in the FOUP, the fingers 136 will not fit within slots 134 at the upper edge 128 of the FOUP, and the fingers 132 will not fit within slots 138 at the bottom edge 130 of the FOUP. It is understood that the shape of the fingers and slots in the upper and lower edges of the FOUP may vary from that shown in FIGS. 14–19 in alternative embodiments, with the provision that the shape of the upper and lower fingers correspond to the shapes of the upper and lower slots when the FOUP door is inserted right side up, and that the shape of the upper and/or lower fingers not fit within the adjacent slots when the FOUP door is inserted into the FOUP up side down.

Figure 20:
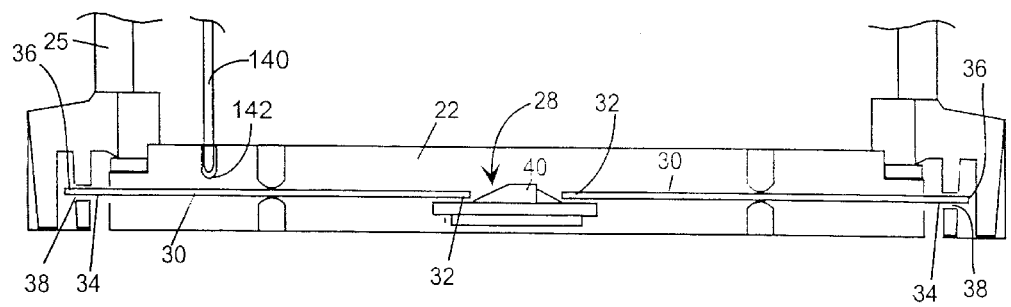
FIG. 20 is a side view of an interior of a FOUP door and shell showing a further alternative embodiment of the present invention for preventing improper coupling of a FOUP door into a FOUP.
Figure 21:
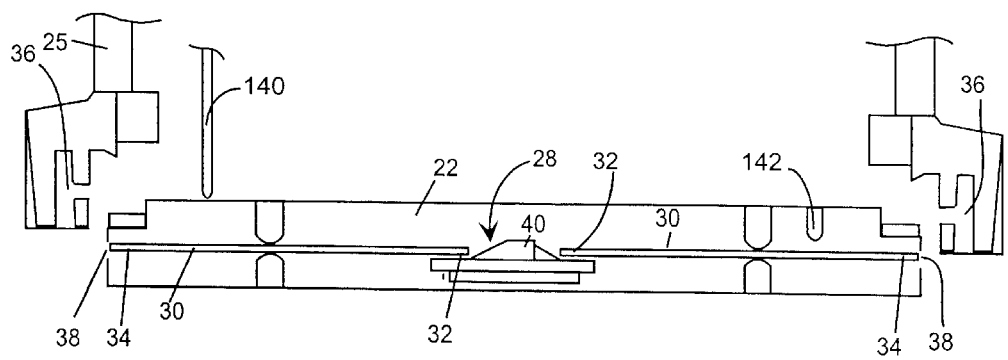
FIG. 21 is a side view of an interior of a FOUP door and shell showing the embodiment of FIG. 20 prevents an up side down FOUP door from being coupled to the FOUP.

Up to this point, improper insertion of the FOUP door into the FOUP has been prevented by asymmetric mounting mechanisms. However, the FOUP door may be mechanically blocked from mating within the FOUP by other mechanisms in alternative embodiments. One such embodiment is shown in FIGS. 20 and 21. In this embodiment, a pin 140 is fixedly mounted somewhere on the interior of the FOUP shell 25 in a position that does not interfere with the wafers being seated or transferred into and out of the FOUP. Such a position may be for example near the corners or sides of the FOUP. The pin 140 may extend out of the open end of the FOUP such that when the FOUP door 22 is properly seated in the FOUP, the pin 140 is received within a well 142 formed in the interior surface of the FOUP door. However, according to this embodiment, when attempt is made to insert the FOUP door up side down, the well 142 is now located at the opposite end of the FOUP as shown in FIG. 21, so that the pin 140 abuts against the interior surface of the FOUP door 22 to prevent the FOUP door 22 from mating within the FOUP. The pin is preferably formed of a low wear material to minimize particulate generation.

The preferred embodiments of the invention described above mechanically prevent a technician from manually coupling a FOUP door to a FOUP in an up side down position. Thus, when a FOUP is received at a load port, it is assured that the FOUP door is in the right side up position, and there is no danger that the FOUP door will contact wafers seated within the load port. It is understood that the various above-described embodiments may be combined with each other to further differentiate the upper fingers and slots from the lower fingers and slots.

Figure 22:
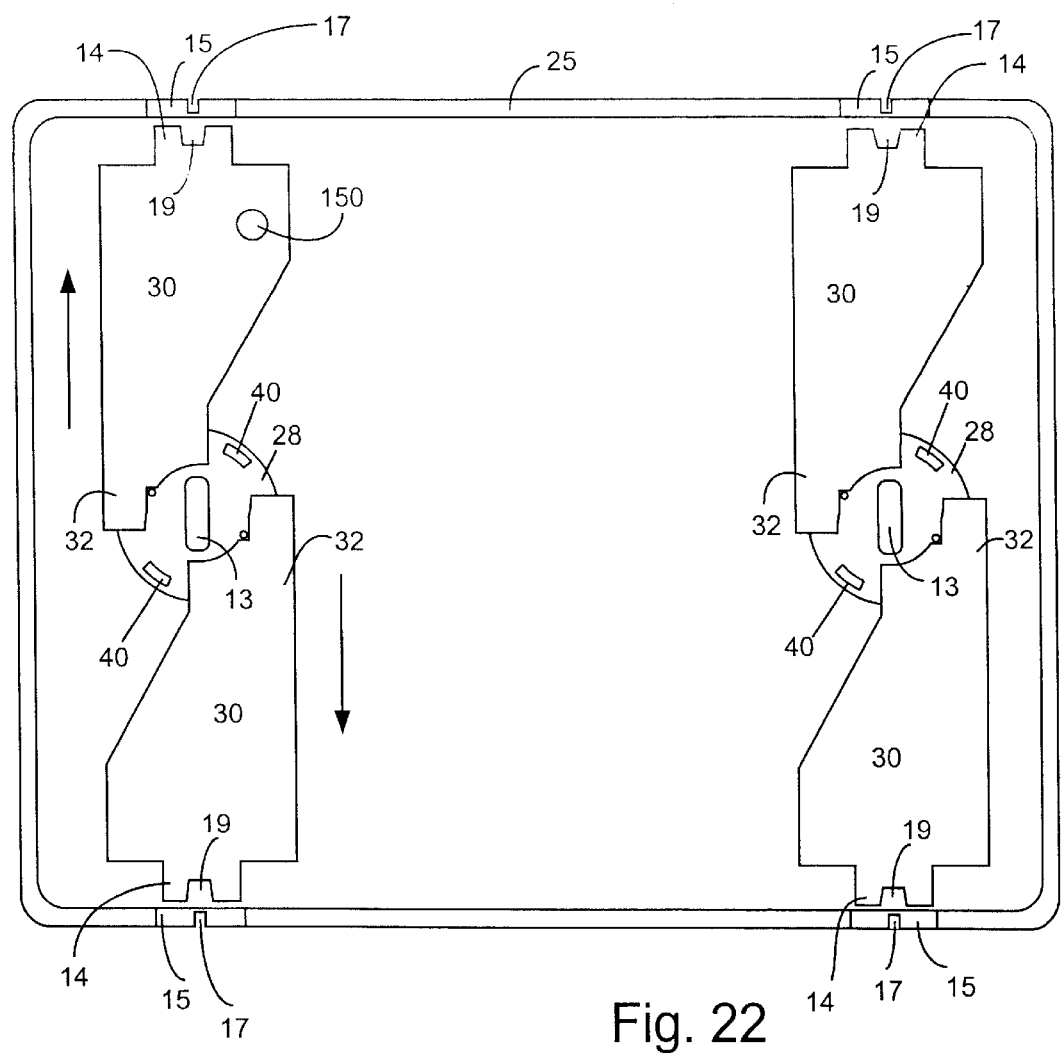
FIG. 22 is a front view of an interior of a FOUP door and shell showing a further alternative embodiment of the present invention for preventing improper coupling of a FOUP door into a FOUP.

In a further alternative embodiment, instead of mechanically preventing improper insertion of a FOUP door into a FOUP by a technician, various sensors may be provided at a load port for ensuring that the FOUP door is in the proper orientation before automated return of the FOUP door to the FOUP. For example, as shown in FIG. 22, a hole 150 may be provided through one of the latch plates 30 in the FOUP door. According to this embodiment, a surface in the FOUP door beneath the hole 150 may for example have a greater reflectance than the latch plates themselves. This embodiment may further include an optical sensor such as a retroreflective sensor mounted in the port door to emit a beam out of the port door to the FOUP. The retroreflective sensor is positioned so that, when the FOUP door is properly positioned right side up, the beam from the retroreflective sensor is transmitted through a transparent window (not shown) in the FOUP door cover, which beam passes through the hole 150 and is reflected back to the sensor. However, if the FOUP door is up side down, the beam will not be transmitted back to the sensor, and the controller can then identify that the FOUP door is in an up side down position and should not be returned to the FOUP. In an alternative to this embodiment, the FOUP door cover may itself have a reflective patch on the outer surface of the cover which aligns with an optical sensor in the port door as described above. In such an embodiment, when the FOUP door is properly positioned right side up, the signal from the optical sensor will be reflected back to the sensor from the reflective patch. However, if the FOUP door is up side down, the signal from the optical sensor will not be reflected back. Thus, the controller can determine whether or not the FOUP door is right side up or up side down and return or not return the FOUP door to the FOUP accordingly.

Although the invention has been described in detail herein, it should be understood that the invention is not limited to the embodiments herein disclosed. Various changes, substitutions and modifications can be made thereto by those skilled in the art without departing from the spirit or scope of the invention.

What is claimed is:

1. A pod for storing and transporting articles comprising:
   a pod shell having an opening and a sealing surface surrounding said opening, and further having multiple latch engagement slots configured such that at least one latch engagement slot is recessed further from said sealing surface than the remaining latch engagement slots; and
   a pod door capable of forming a seal with said sealing surface, said pod door having a latch mechanism includes a first latch plate having two latch fingers and a second latch plate having one finger, said fingers adapted to engage said latch engagement slots when said fingers are aligned with said latch engagement slots.

2. A pod for storing and transporting articles according to claim 1, wherein at least one latch engagement slot is a different shape than the remaining latch engagement slots.

3. A pod for storing and transporting articles comprising:
   a pod shell having an opening and a sealing surface surrounding said opening, and further having multiple latch engagement slots configured such that at least one latch engagement slot is recessed further from said sealing surface than the remaining latch engagement slots, at least one said latch engagement slot extendings through said pod shell at a different angle than the remaining said latch engagement slots; and
   a pod door capable of forming a seal with said sealing surface, said pod door having a latch mechanism that includes fingers adapted to engage said latch engagement slots when said fingers are aligned with said latch engagement slots.

4. A for storing and transporting workpieces in an environment isolated from ambient atmospheric conditions, comprising:
   a container shell having an opening and a sealing surface surrounding said opening, said opening defining a substantially vertical plane, and further having multiple latch engagement slots configured such that at least one latch engagement slot is a different shape than the remaining said latch engagement slots, said latch engagement slots being recessed from said substantially vertical plane, at least one latch engagement slot being recessed further from said substantially vertical plane than the remaining said latch engagement slots; and
   a container door capable of forming a seal with said sealing surface, said container door having means for coupling said container door with said container shell by engaging said latch engagement slots.

5. A pod for storing and transporting articles, comprising:
- a pod shell having an opening, said pod shell having single latch engagement slots and double latch engagement slots; and
- a pod door capable of forming a seal with said pod shell, said pod door having a latch mechanism that includes a first latch plate with o/ne finger able to engage said single latch engagement slot when said finger is aligned with said single latch engagement slot, and a second latch plate with two fingers able to engage said double latch engagement slot when said fingers are aligned with said double latch engagement slots.

6. The pod as recited in claim 5, wherein at least one latch engagement slot is recessed further from said opening than the remaining said latch engagement slots.

7. A wafer container comprising:
- an enclosure portion having a plurality of wafer shelves therein adapted for holding a plurality of wafers in a horizontal spaced apart position relative to each other, said enclosure portion having a door frame defining an opening, said door frame having a plurality of latch engagement recesses defined therein; and
- a door positionable in said door frame to sealingly close said opening, said door positionable in said door frame in a favored orientation and at least one disfavored orientation, said door having at least one selectively operable latch mechanism including a plurality of latch plates for engaging said latch engagement recesses, said latch plates and said latch engagement recesses being shaped and positioned so that said latch plates are engagable in said latch engagement recesses when said door is positioned in said door frame in said favored orientation and so that said latch plates are not engageable in said latch engagement recesses when said door is positioned in said at least one disfavored orientation.

8. The wafer container of claim 7, wherein said plurality of latch plates includes a first latch plate having a plurality of latch fingers and a second latch plate having one latch finger.

9. The wafer container of claim 7, wherein said plurality of latch plates includes a first latch plate and a second latch plate, and wherein said first latch plate has a length dimension greater than a length dimension of said second latch plate.

10. The wafer container of claim 7, wherein said opening includes a sealing surface surrounding said opening, and wherein at least one latch engagement recess is recessed further from said sealing surface than the remaining latch engagement slots.

11. The wafer container of claim 7, wherein at least one latch engagement recess has a different shape from the remainder of said latch engagement recesses.

12. The wafer container of claim 7, wherein at least one latch plate has a different cross-sectional shape from the remainder of said latch plates.

* * * * *